(12) United States Patent
Yang et al.

(10) Patent No.: US 10,128,451 B2
(45) Date of Patent: Nov. 13, 2018

(54) FLEXIBLE DISPLAY SUBSTRATE, FLEXIBLE DISPLAY PANEL, AND FLEXIBLE DISPLAY APPARATUS, AND FABRICATION METHODS THEREOF

(71) Applicant: BOE TECHNOLOGY GROUP CO., LTD., Beijing (CN)

(72) Inventors: Jing Yang, Beijing (CN); Peng Cai, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 15/534,270

(22) PCT Filed: Dec. 23, 2016

(86) PCT No.: PCT/CN2016/111742
§ 371 (c)(1),
(2) Date: Jun. 8, 2017

(87) PCT Pub. No.: WO2017/118302
PCT Pub. Date: Jul. 13, 2017

(65) Prior Publication Data
US 2018/0123059 A1 May 3, 2018

(30) Foreign Application Priority Data
Jan. 5, 2016 (CN) .......................... 2016 1 0006102

(51) Int. Cl.
*H01L 33/00* (2010.01)
*H01L 51/00* (2006.01)
(Continued)

(52) U.S. Cl.
CPC ........ *H01L 51/0097* (2013.01); *H01L 51/003* (2013.01); *H01L 51/56* (2013.01);
(Continued)

(58) Field of Classification Search
CPC ... H01L 51/0097; H01L 51/003; H01L 51/56; H01L 27/3276; H01L 2227/323;
(Continued)

(56) References Cited

U.S. PATENT DOCUMENTS

2005/0168141 A1* 8/2005 Henseler ............. H01L 51/0097
313/506
2005/0269943 A1* 12/2005 Hack .................. H01L 51/0097
313/504

(Continued)

FOREIGN PATENT DOCUMENTS

CN 103681486 A 3/2014
CN 103681763 A 3/2014
(Continued)

OTHER PUBLICATIONS

The World Intellectual Property Organization (WIPO) International Search Report and Written Opinion for PCT/CN2016/111742 dated Mar. 28, 2017 10 Pages.

*Primary Examiner* — Sitaramarao S Yechuri
(74) *Attorney, Agent, or Firm* — Anova Law Group, PLLC

(57) ABSTRACT

Flexible display substrate, flexible display panel, and display apparatus, and their fabrication methods are provided. In an exemplary flexible display substrate, a motherboard is formed on a rigid substrate that is magnetisable. The motherboard includes a magnetic first flexible substrate and a plurality of flexible display panels on the magnetic first flexible substrate. When the rigid substrate is magnetized, the motherboard is cut to separate the plurality of flexible display panels from each other, followed by demagnetizing the rigid substrate.

18 Claims, 6 Drawing Sheets

(51) Int. Cl.
*H01L 51/56* (2006.01)
*H01L 27/32* (2006.01)
(52) U.S. Cl.
CPC .... *H01L 27/3276* (2013.01); *H01L 2227/323* (2013.01); *H01L 2227/326* (2013.01); *H01L 2251/301* (2013.01); *H01L 2251/303* (2013.01); *H01L 2251/5338* (2013.01); *H01L 2251/558* (2013.01); *H01L 2251/566* (2013.01)
(58) Field of Classification Search
CPC ......... H01L 2227/326; H01L 2251/301; H01L 2251/303; H01L 2251/5338; H01L 2251/558; H01L 2251/566
See application file for complete search history.

(56) References Cited

U.S. PATENT DOCUMENTS

| | | | | |
|---|---|---|---|---|
| 2006/0154569 A1* | 7/2006 | Doyle | ............ | B24B 37/04 451/8 |
| 2009/0087644 A1* | 4/2009 | Supriya | ............ | H01L 23/373 428/327 |
| 2013/0011969 A1* | 1/2013 | Chen | ............ | H01L 51/003 438/111 |
| 2013/0095592 A1* | 4/2013 | Koresawa | ............ | H01L 51/003 438/46 |
| 2014/0085907 A1 | 3/2014 | Jun | | |
| 2015/0239210 A1* | 8/2015 | Jeong | ............ | B32B 7/06 428/336 |
| 2016/0028012 A1 | 1/2016 | Cheng et al. | | |
| 2017/0317317 A1* | 11/2017 | Xu | ............ | H01L 51/56 |

FOREIGN PATENT DOCUMENTS

| | | |
|---|---|---|
| CN | 104820306 A | 8/2015 |
| CN | 105428393 A | 3/2016 |
| CN | 105679806 A | 6/2016 |
| CN | 105870327 A | 8/2016 |
| JP | 2006301900 | 11/2006 |
| WO | 2017118302 A1 | 7/2017 |

* cited by examiner

FLEXIBLE DISPLAY SUBSTRATE, FLEXIBLE DISPLAY PANEL, AND FLEXIBLE DISPLAY APPARATUS, AND FABRICATION METHODS THEREOF

CROSS-REFERENCES TO RELATED APPLICATIONS

This application is a national phase entry under 35 U.S.C. § 371 of International Application No. PCT/CN2016/111742, filed on Dec. 23, 2016, which claims priority to Chinese Patent Application No. 201610006102.3, filed on Jan. 5, 2016, the entire contents of both of which are incorporated by reference herein.

TECHNICAL FIELD

The disclosed subject matter generally relates to display technologies and, more particularly, relates to a flexible display substrate, a flexible display panel, and a display apparatus, and their fabrication methods.

BACKGROUND

With the rapid development of display technologies, flexible display panels are thin, light, anti-drop, flexible, energy saving, and favored by many users. Thus the flexible display panel has become a focus of recent research.

A conventional process for fabricating a flexible display panel generally includes the following steps. First, coating a polyimide (PI) film as the flexible substrate on a rigid substrate, or adhering a flexible substrate on a rigid substrate using a heat-pressure-sensitive machine; then, forming a motherboard from the flexible substrate including multiple flexible display panels arranged in a matrix; next, releasing the motherboard to be separated from the rigid substrate; finally, cutting the motherboard to obtain multiple independent flexible display panels, and binding flexible printed circuit boards on each flexible display panel.

In the conventional fabricating process, after the releasing the motherboard, during the subsequent cutting and binding processes, the motherboard may prone to warping due to the flexibility, which may not only increase the difficulty of the cutting and binding processes, but also increase the possibility to damage the flexible display panel, thus affecting the performance of the flexible display panel.

Accordingly, it is desirable to provide a flexible display substrate and a fabrication method thereof, a flexible display panel, and related apparatuses to at least partially alleviate one or more problems set forth above and to solve other problems in the art.

BRIEF SUMMARY

In accordance with various embodiments of the disclosed subject matter, flexible display substrate, flexible display panel, and display apparatus, and their fabrication methods are provided.

One aspect of the present disclosure provides a method for fabricating a flexible display substrate. In the method, a motherboard is formed on a rigid substrate that is magnetisable. The motherboard includes a magnetic first flexible substrate and a plurality of flexible display panels on the magnetic first flexible substrate. When the rigid substrate is magnetized, the motherboard is cut to separate the plurality of flexible display panels from each other, followed by demagnetizing the rigid substrate.

Optionally, the motherboard is formed by: coating the magnetic first flexible substrate on the rigid substrate; and using the magnetic first flexible substrate as a base substrate to form the motherboard including the plurality of flexible display panels.

Optionally, the method further includes: after forming the motherboard, and before cutting the motherboard to separate the plurality of flexible display panels, separating the motherboard from the rigid substrate.

Optionally, the step of coating the magnetic first flexible substrate on the rigid substrate includes coating a first polyimide gel film that is doped with a magnetic material on the rigid substrate; and solidifying the first polyimide gel film that is doped with the magnetic material to form the magnetic first flexible substrate.

Optionally, the motherboard is formed by: placing the magnetic first flexible substrate on the rigid substrate; and using the magnetic first flexible substrate as a base substrate to form the motherboard including the plurality of flexible display panels on the magnetic first flexible substrate.

Optionally, the method further includes: coating a second polyimide gel film on the magnetic first flexible substrate; solidifying the second polyimide gel film to form a second flexible substrate, and using the magnetic first flexible substrate and the second flexible substrate as a base substrate to form the motherboard including the plurality of flexible display panels on the base substrate.

Optionally, a thickness of the second flexible substrate is between 10 μm to 15 μm.

Optionally, the method further includes: after forming the second flexible substrate and before forming the motherboard including the plurality of flexible display panels, forming a planarization layer by stacking a silicon nitride film and a silicon oxide film on the second flexible substrate.

Optionally, the method further includes: after cutting the motherboard to separate the plurality of flexible display panels from each other, and before demagnetizing the rigid substrate, binding a flexible printed circuit board on each of the plurality of flexible display panels.

Optionally, the rigid substrate is magnetized by charging the rigid substrate; and the rigid substrate is demagnetized by discharging the rigid substrate.

Another aspect of the present disclosure provides a flexible display substrate, including: a magnetic first flexible substrate; and a plurality of display units on the magnetic first flexible substrate.

Optionally, the magnetic first flexible substrate is a cured polyimide gel film doped by a magnetic material.

Optionally, a thickness of the magnetic first flexible substrate is between 5 μm to 10 μm.

Optionally, the magnetic material includes at least one of iron-chromium-cobalt particles, aluminum-nickel-cobalt particles, samarium-cobalt particles, rubidium-iron-boron particles, and neodymium-iron-boron particles.

Optionally, a mass ratio of the magnetic material in the magnetic first flexible substrate is between 15% and 25%.

Optionally, the flexible display substrate further includes: a second flexible substrate between the magnetic first flexible substrate and the plurality of display units. The second flexible substrate is a polyimide gel film.

Optionally, a thickness of the second flexible substrate is between 10 μm to 15 μm.

Optionally, the flexible display substrate further includes: a planarization layer between the second flexible substrate and the plurality of display units. The planarization layer includes a silicon nitride film and a silicon oxide film that are stacked sequentially on the second flexible substrate.

Another aspect of the present disclosure provides a flexible display panel including the disclosed flexible display substrate.

Another aspect of the present disclosure provides a display apparatus including the disclosed flexible display panel.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides a flexible display substrate and a fabrication method thereof, a flexible display panel, and related apparatuses.

In an exemplary method for fabricating a flexible display substrate, a motherboard is formed on a rigid substrate that is magnetisable. The motherboard includes a magnetic first flexible substrate and a plurality of flexible display panels on the magnetic first flexible substrate. When the rigid substrate is magnetized, the motherboard is cut to separate the plurality of flexible display panels from each other, which may be followed by demagnetizing the rigid substrate.

In the disclosed fabricating method, a motherboard including a magnetic first flexible substrate can be formed on a rigid substrate that is magnetisable. During the cutting process, the rigid substrate that is magnetized can generate a magnetic force to attract the magnetic first flexible substrate. Thus the motherboard including the magnetic first flexible substrate can be attached to the rigid substrate. Therefore, the warping of the motherboard can be prevented during the cutting process, which may not only facilitate the cutting process, but also avoid potential damage to the flexible display panels, thereby improving the yield of the flexible display panels. Additionally, after completing the cutting process, the motherboard and the rigid substrate can be separated by demagnetizing the rigid substrate, which is simple and reliable.

Figure 1A:
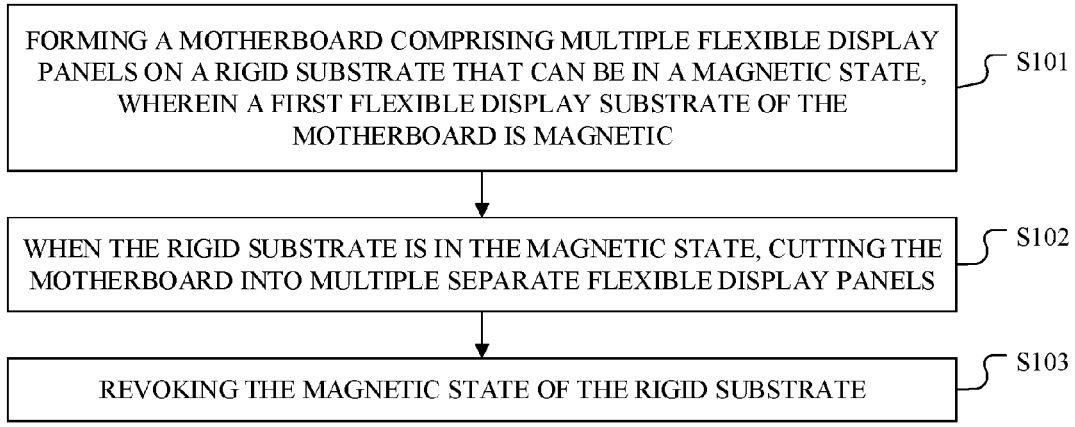
FIGS. 1A and 2-5 are flowcharts of various exemplary methods for fabricating a flexible display panel in accordance with some embodiments of the disclosed subject matter.

Referring to FIG. 1A, a flowchart of an exemplary method for fabricating a flexible display panel is shown in accordance with some embodiments of the disclosed subject matter. As illustrated, the method can include the following steps.

Step S101: forming a motherboard including multiple flexible display panels on a rigid substrate that is magnetisable, and the motherboard has a magnetic first flexible display substrate;

Step S102: when the rigid substrate is magnetized, cutting the motherboard into multiple separate flexible display panels;

Step S103: demagnetizing the rigid substrate.

Figure 1B:
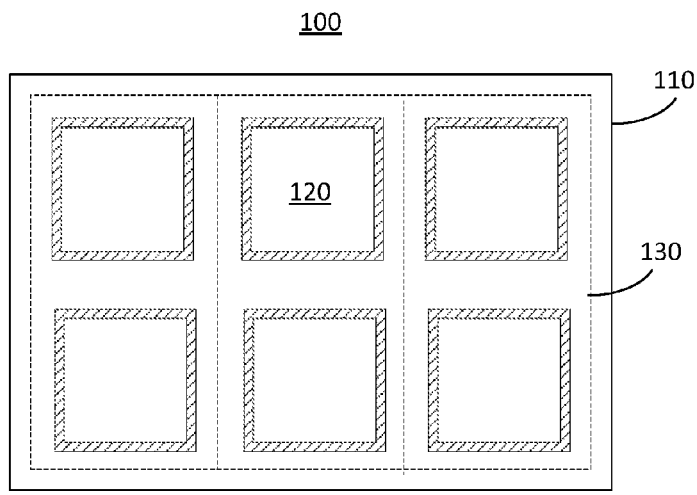
FIG. 1B illustrates an exemplary motherboard in accordance with some embodiments of the disclosed subject matter.

FIG. 1B illustrates an exemplary motherboard in accordance with various disclosed embodiments of the present disclosure. The exemplary motherboard 100 may include a magnetic first flexible substrate 110 and a plurality of flexible display panels 120 on the magnetic first flexible substrate 110. In various embodiments, the motherboard 100 may be cut to provide flexible display panels 120 separated from each other by a cutting process, for example, along cutting lines 130 shown in FIG. 1B.

The exemplary motherboard 100 may be formed on a rigid substrate (not shown in FIG. 1B). The rigid substrate may have a controllable magnetism to attract and lock the magnetic first flexible substrate 110 of the motherboard 100 in place, e.g., thus to provide a flat flexible substrate, for a desired process. For example, the motherboard 100 may be cut into discrete flexible display panels 120, when the rigid substrate is controlled to have the magnetism.

In various embodiments, each of the flexible display panels 120 may include a plurality of display units corresponding to pixel units for display.

In a conventional fabricating process, after releasing the motherboard, the motherboard may prone to warping due to the flexibility during the subsequent cutting and binding processes. The disclosed method for fabricating the flexible display panels, the cutting process is performed when the rigid substrate is magnetized. The rigid substrate that is magnetized can attract the magnetic first flexible substrate of the motherboard. Thus the warping of the motherboard can be prevented during the cutting process, which may not only facilitates the cutting process, but also avoid potential damage to the flexible display panels, thereby improving the yield of the flexible display panels. Additionally, after completing the cutting process, the motherboard and the rigid substrate can be separated by demagnetizing the rigid substrate, which is simple and reliable.

In some embodiments, the first flexible substrate may be formed using a coating process, or a flexible substrate can be directly used. In the following, two specific examples of the method for fabricating the flexible display panels are described in detail.

Figure 2:
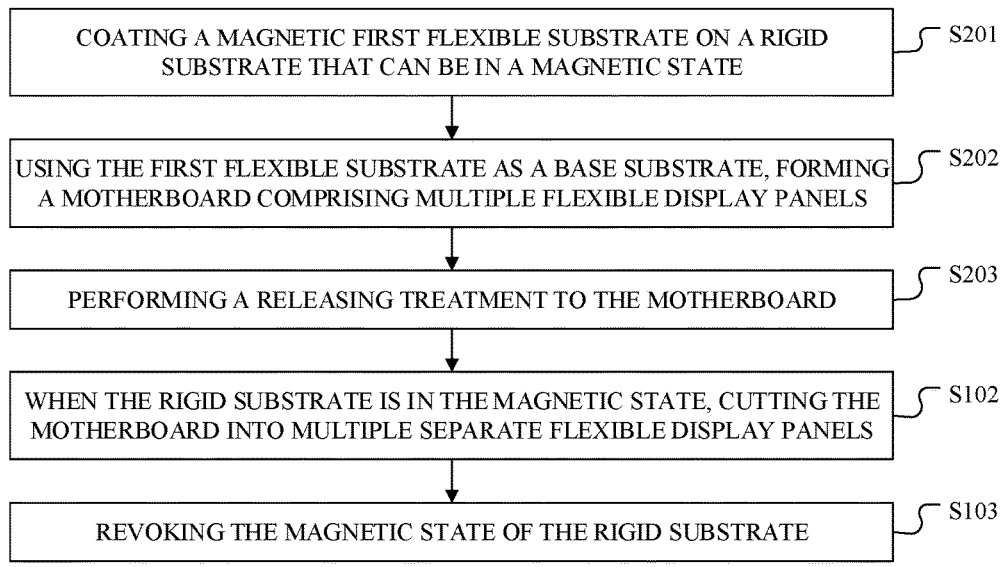

As illustrated in FIG. 2, the Step 101 for forming a motherboard comprising multiple flexible display panels on a rigid substrate that is magnetisable can include the following steps:

Step S201: coating a magnetic first flexible substrate on a rigid substrate that is magnetisable;

Step S202: using the first flexible substrate as a base substrate, forming a motherboard including multiple flexible display panels.

Specifically, the flexible display panel can be a Liquid Crystal Display (LCD) panel, an Organic Electroluminescent Display (OLED) panel, a flexible electric paper, or any other suitable display panel.

Taking a motherboard comprising multiple OLED panels as an example, any suitable components, such as a thin film transistor, an anode, a cathode, a light emitting layer, etc. can be formed on the first flexible substrate sequentially.

As illustrated in FIG. 2, after the Step 202 for forming the motherboard comprising multiple flexible display panels, and before performing Step S102 for cutting the motherboard into multiple separate flexible display panels, the method can further include the following steps:

Step S203: performing a releasing process to the motherboard. In one embodiment, a laser irradiation can be used to release the motherboard. In some embodiments, a laser wavelength can be around 308 nm, and a laser energy range can be from about 180 mJ/cm$^2$ to about 240 mJ/cm$^2$.

If the releasing process is performed after cutting the motherboard into multiple separate flexible display panels, then the multiple flexible display panels need to be released one by one, which requires complicated operations. In order to simplify the releasing process, the releasing treatment can be performed to the motherboard before the cutting process.

After the releasing treatment, the motherboard is separated from the rigid substrate. And Step S102 can be performed subsequently. Thus the motherboard can be cut into multiple separate flexible display panels when the rigid substrate is magnetized. The rigid substrate that is magnetized can attract the magnetic first flexible substrate of the motherboard. Thus the warping of the motherboard can be prevented during the cutting process, which may not only facilitate the cutting process, but also avoid potential damage to the flexible display panels, thereby improving the yield of the flexible display panels.

After completing the cutting process, the Step 103 can be performed to separate the motherboard and the rigid substrate by demagnetizing the rigid substrate. Therefore, the separation operation is simple and reliable.

Figure 3:
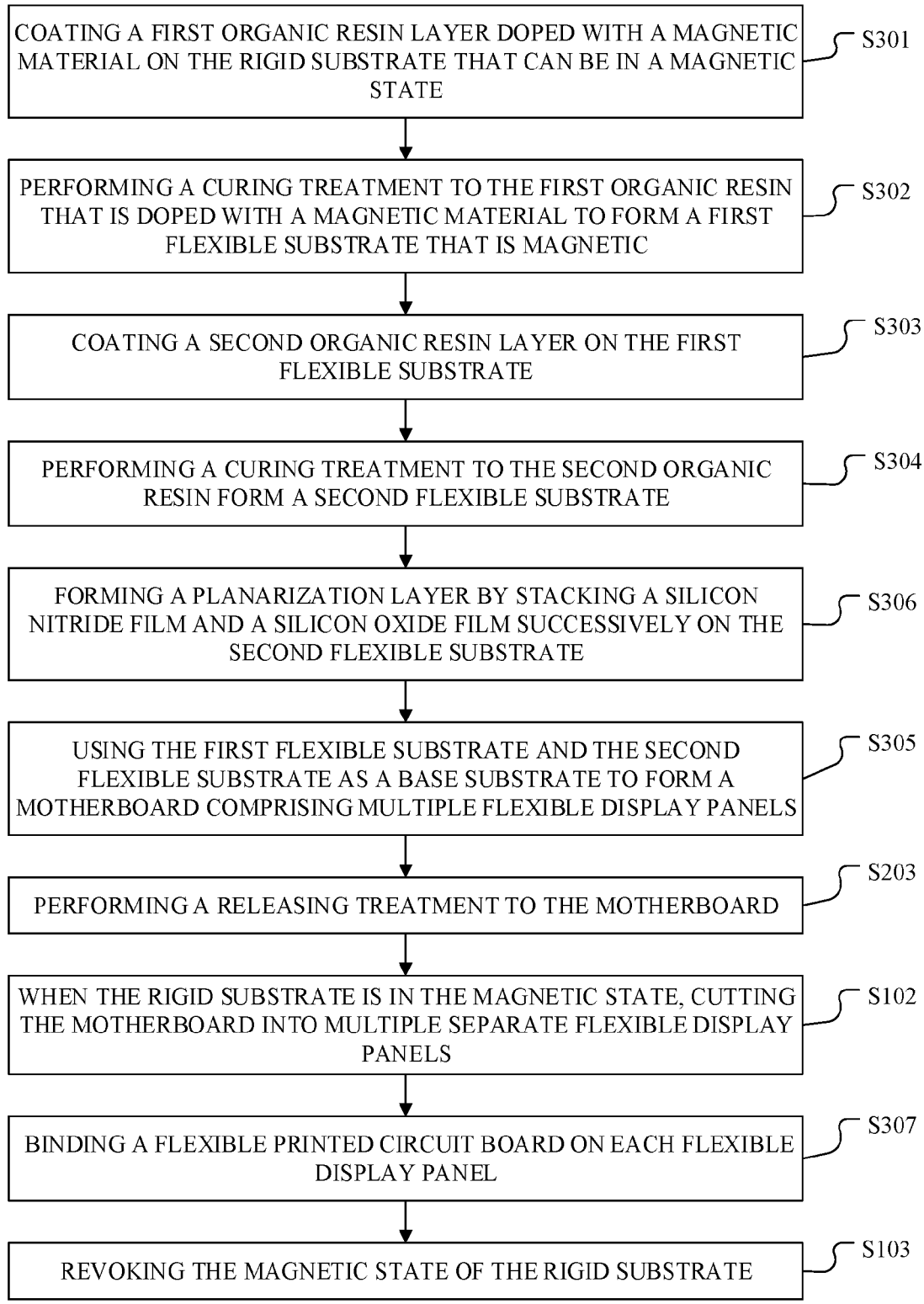

In some embodiments, the Step 201 for coating the magnetic first flexible substrate on a rigid substrate that is magnetisable can include the following steps, as illustrated in FIG. 3.

Step S301: coating a first organic resin layer doped with a magnetic material on the rigid substrate that is magnetisable. In some embodiments, the first organic resin can be a polyimide (PI) glue, or any other suitable organic resin material.

Step S302: performing a curing treatment to the first organic resin that is doped with a magnetic material to form a first flexible substrate that is magnetic. For example, a polyimide (PI) glue doped with a magnetic material can be cured to form a magnetic first flexible substrate. For example, a temperature range of the curing treatment can be set from 300° C. to 400° C.

It should be noted that, the magnetic material is doped in the first flexible substrate, Thus the first flexible substrate can contain more magnetic material if the thickness of the first flexible substrate is larger, therefore the first flexible substrate can have more magnetism. That is, the thickness of the first flexible substrate is positively proportional to the magnetic magnitude of the first flexible substrate. Therefore, a first flexible substrate having a too small thickness may not have enough magnetic force to attract the rigid substrate, which may cause warping of the motherboard during the cutting process. On the other hand, a first flexible substrate having a too large thickness may increase the total thickness of the flexible display panels. Based on the above factors, in some embodiments, a thickness of the first flexible substrate can be in a range of 5 μm to 10 μm. However, the thickness of the first flexible substrate can be adjusted according to actual needs, and should not be limited herein.

In some embodiments, the doped magnetic material can be any suitable material that can be magnetized. Non-limiting examples of the doped magnetic material may include iron-chromium-cobalt, aluminum-nickel-cobalt, samarium-cobalt, rubidium-iron-boron, and neodymium-iron-boron.

Such magnetic material may include magnetic material particles, for example, having an average size of about 800 nm to about 1500 nm. The magnetic material particles may be selected to provide sufficient small size such that a single particle contains a small number of magnetic domains. For example, a single particle may contain a single magnetic domain. In this case, the magnetic material particle may be unlikely to have magnetic anisotropy. When an external magnetic field is applied to the magnetic material particles, the magnetic particles can be rapidly magnetized and magnetically enhanced.

In various embodiments, the rigid substrate may be a metallic substrate, for example, formed by iron, nickel, cobalt, or their alloys. The rigid substrate may internally include a coil having a low resistance. The coil may be connected to a power supply. When the coil of the rigid substrate is charged, a strong magnetic field may be produced to magnetize the magnetic material in the first flexible substrate to provide a large magnetism.

The first flexible substrate, e.g., a polyimide (PI) film, doped with magnetic material particles, may be attracted on the rigid substrate to provide a flat first flexible substrate ready for any subsequent process(es). After those process(es), the power may be turned off, and the magnetism of the rigid substrate may be removed to allow the first flexible substrate to be separated from the rigid substrate.

It should be noted that, the doping ratio of the magnetic material in the first flexible substrate is positively proportional to the magnetic magnitude of the first flexible substrate, Thus the first flexible substrate can have more magnetism if the doping ratio of the magnetic material of the first flexible substrate is larger. Therefore, a first flexible substrate having a too small doping ratio of the magnetic material may not have enough magnetic force to attract the rigid substrate, which may cause warping of the motherboard during the cutting process. On the other hand, a first flexible substrate having a too large doping ratio of the magnetic material may decrease the flexibility of the flexible display panels. Based on the above factors, in some embodiments, a mass ratio of the magnetic material in the first flexible substrate can be in a range of 15% to 25%. However, the doping ratio of the magnetic material of the first flexible substrate can be adjusted according to actual needs, and should not be limited herein.

Since the first flexible substrate is doped with particulate magnetic material, the surface of the first flexible substrate may be very rough. In order to provide a smooth substrate to the flexible display panels, the Step 202 for forming a motherboard comprising multiple flexible display panels can further include the following steps, as illustrated in FIG. 3.

Step S303: coating a second organic resin layer on the first flexible substrate. In some embodiments, the second organic resin layer can be a polyimide (PI) glue, or any other suitable organic resin material.

Step S304: performing a curing treatment to the second organic resin to form a second flexible substrate. For example, a polyimide (PI) glue can be cured to form a second flexible substrate. Specifically, a temperature range of the curing treatment can be set from 300° C. to 400° C.

Step S305: using the first flexible substrate and the second flexible substrate as a base substrate to form a motherboard comprising multiple flexible display panels.

It should be noted that, a too large thickness of the second flexible substrate may increase the total thickness of the flexible display panels, while a too small thickness of the second flexible substrate may not sufficiently alleviate the roughness of the first flexible substrate. Based on the above factors, in some embodiments, a thickness of the second flexible substrate can be in a range of 10 µm to 15 µm.

In order to further alleviate the roughness of the first flexible substrate and provide a more smooth substrate to the flexible display panels, after performing Step 304 for forming the second flexible substrate, and before performing Step 305 for forming a motherboard comprising multiple flexible display panels, the disclosed method can further include the following step, as illustrated in FIG. 3.

Step S306: forming a planarization layer by stacking a silicon nitride film and a silicon oxide film sequentially on the second flexible substrate.

The embodiment of the disclosed method is particularly useful for fabricating a flexible OLED. The silicon nitride film and the silicon oxide film can be not only used as the planarization layer, but also as a barrier layer for preventing the oxygen and water in the external environment from entering the flexible OLED to cause damages to the flexible OLED.

It should be noted that, the planarization layer is not limited to the stacked silicon nitride film and silicon oxide film. Any other suitable film of similar material can be selected to form the planarization layer, which is not limited herein.

In some embodiments, the disclosed method can also be applied to fabricate active driving flexible display panels. After performing Step S102 for cutting the motherboard into multiple separate flexible display panels, and before performing Step S103 for demagnetizing the rigid substrate, the method can further include the following step, as illustrated in FIG. 3.

Step S307, binding a flexible printed circuit board on each flexible display panel. The binding process can be performed when the rigid substrate is magnetized. The rigid substrate that is magnetized can attract the magnetic first flexible substrate of the motherboard. Thus the warping of the motherboard can be prevented during the binding process, which may not only facilitate the binding process, but also avoid potential damage to the flexible display panels, thereby improving the yield of the flexible display panels. Additionally, after completing the binding process, Step 103 can be performed to separate the motherboard from the rigid substrate by demagnetizing the rigid substrate. The separation operation is simple and reliable.

In some embodiments, the rigid substrate that is magnetisable may be a rigid substrate capable of being charged and discharged. In such embodiments, in the Step S102, the rigid substrate can be charged to have magnetism, and in the step S103, the rigid substrate can be discharged to revoke the magnetism. The changing and discharging process can provide a quick and simple control of the generation and revocation of the magnetism of the rigid substrate.

It should be noted that, any other suitable method can be used to generate or revoke the magnetism of the rigid substrate, and should not be limited herein. For example, a magnet can be placed on a side of the rigid substrate that is away from the first flexible substrate to make the rigid substrate to have magnetism. And the magnetism can be revoked by removing the magnet from the rigid substrate.

It also should be noted that, the disclosed method can further be suitable when the releasing process of the motherboard is performed after the cutting process. In such cases, the warping of the motherboard can be prevented during the cutting process because the first flexible substrate is attracted by and attached to the rigid substrate that is magnetized.

However, it is preferred that the bonding process should be performed after the releasing process in order to prevent damage to the bonded flexible printed circuit boards during the releasing process. After the releasing process, the bonding process can be performed when the rigid substrate is magnetized. The rigid substrate that is magnetized can attract the magnetic first flexible substrate of the motherboard. Thus the warping of the motherboard can be prevented during the binding process, which may not only facilitate the binding process, but also avoid potential damage to the flexible display panels, thereby improving the yield of the flexible display panels. Additionally, after completing the binding process, Step 103 can be performed to separate the motherboard from the rigid substrate by demagnetizing the rigid substrate. The separation operation is simple and reliable.

Figure 4:
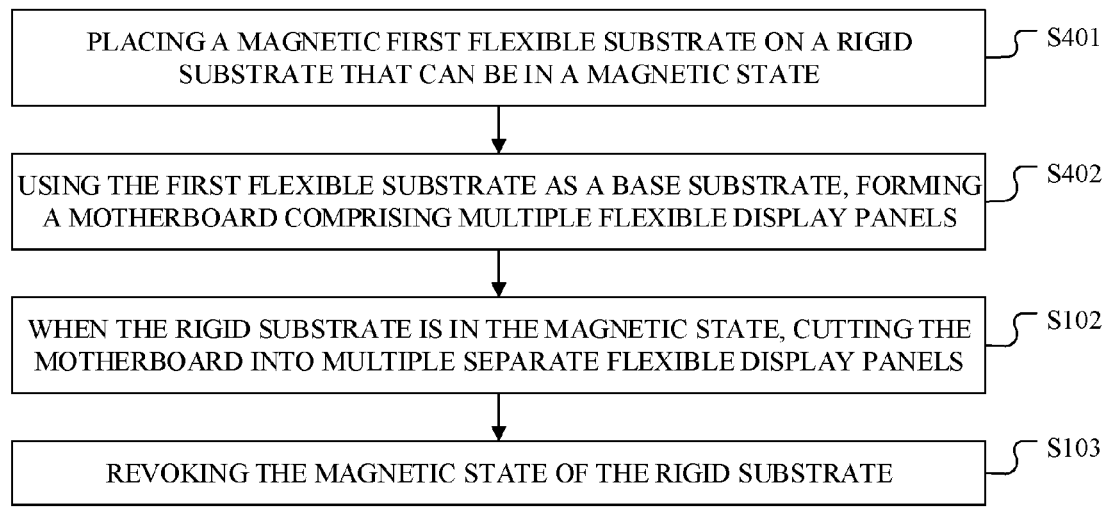

In some other embodiments, as illustrated in FIG. 4, the Step 101 for forming a motherboard comprising multiple flexible display panels on a rigid substrate that is magnetisable can include the following steps:

Step S401: placing a magnetic first flexible substrate on a rigid substrate that is magnetisable. The magnetic first flexible substrate can be obtained by doping a magnetic material into an existing flexible substrate.

Step S402: using the first flexible substrate as a base substrate, and forming a motherboard comprising multiple flexible display panels.

In various embodiments, the flexible display panel can be a Liquid Crystal Display (LCD) panel, an Organic Electroluminescent Display (OLED) panel, a flexible electric paper, or any other suitable display panel.

Taking a motherboard comprising multiple OLED panels as an example, any suitable components, such as a thin film transistor, an anode, a cathode, a light emitting layer, etc. can be formed on the first flexible substrate sequentially.

In the disclosed method illustrated in FIG. 4, a magnetic first flexible substrate can be placed on a rigid substrate that is magnetisable. Since there is no adhesive force between the first flexible substrate and the rigid substrate, in order to prevent the warping of the motherboard in the subsequent processes, the motherboard comprising multiple flexible display panels can be formed when the rigid substrate is magnetized. The rigid substrate that is magnetized can generate a magnetic force to attract the magnetic first flexible substrate of the motherboard. Thus the motherboard can be attached on the rigid substrate, thereby preventing the warping of the motherboard during the fabricating process.

Comparing to existing method for fabricating the flexible display panels, the disclosed method does not use a heat-pressure-sensitive machine to adhere the first flexible substrate on the rigid substrate, thereby can avoid introducing particles and generating bubbles.

Next, Step S102 can be performed subsequently. Thus the motherboard can be cut into multiple separate flexible display panels when the rigid substrate has magnetism. The rigid substrate that is magnetized can attract the magnetic first flexible substrate of the motherboard. Thus the warping of the motherboard can be prevented during the cutting process, which may not only facilitate the cutting process, but also avoid potential damage to the flexible display panels, thereby improving the yield of the flexible display panels.

After completing the cutting process, the Step 103 can be performed to separate the motherboard from the rigid substrate by demagnetizing the rigid substrate. Therefore, the separation operation is simple and reliable.

Figure 5:
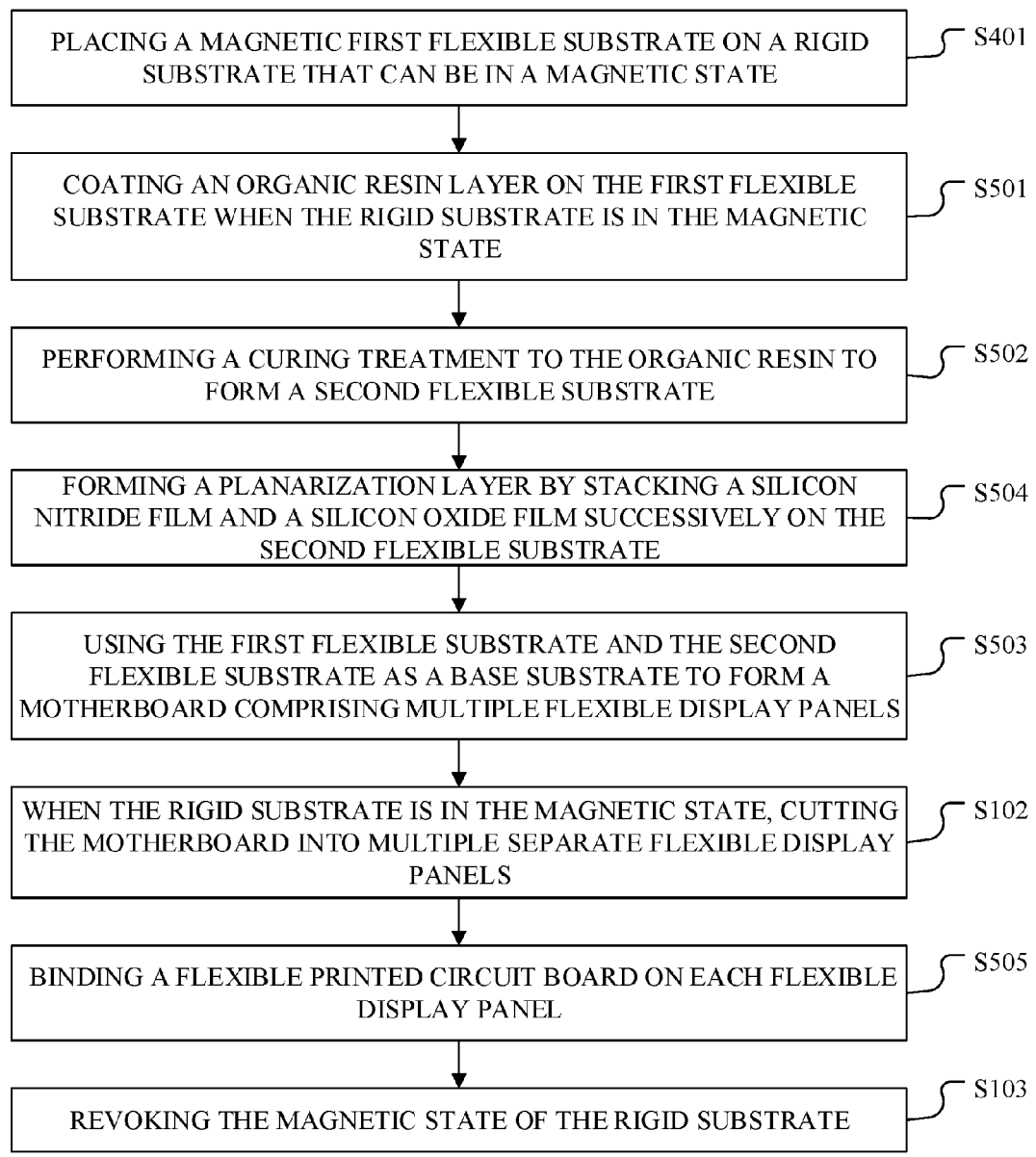

Since the first flexible substrate is doped with particulate magnetic material, the surface of the first flexible substrate may be very rough. In order to provide a smooth substrate to the flexible display panels, the Step 402 for forming a motherboard comprising multiple flexible display panels can further include the following steps, as illustrated in FIG. 5.

Step S501: coating an organic resin layer on the first flexible substrate when the rigid substrate is magnetized. In some embodiments, the first organic resin can be a polyimide (PI) glue, or any other suitable organic resin material.

Step S502: performing a curing treatment to the organic resin to form a second flexible substrate. For example, a polyimide (PI) gel film can be cured to form a second flexible substrate. Specifically, a temperature range of the curing treatment can be set from 300° C. to 400° C.

Step S503: using the first flexible substrate and the second flexible substrate as a base substrate to form a motherboard comprising multiple flexible display panels.

It should be noted that, a too large thickness of the second flexible substrate may increase the total thickness of the flexible display panels, while a too small thickness of the second flexible substrate may not sufficiently alleviate the roughness of the first flexible substrate. Based on the above factors, in some embodiments, a thickness of the second flexible substrate can be in a range of 10 µm to 15 µm.

In order to further alleviate the roughness of the first flexible substrate and provide a more smooth substrate to the flexible display panels, after performing Step 502 for forming the second flexible substrate, and before performing Step 503 for forming a motherboard comprising multiple flexible display panels, the disclosed method can further include the following step, as illustrated in FIG. 5.

Step S504: forming a planarization layer by stacking a silicon nitride film and a silicon oxide film sequentially on the second flexible substrate.

The embodiment of the disclosed method is particularly useful for fabricating a flexible OLED. The silicon nitride film and the silicon oxide film can be not only used as the planarization layer, but also as a barrier layer for preventing the oxygen and water in the external environment from entering the flexible OLED and from causing damage to the flexible OLED.

It should be noted that, the planarization layer is not limited to the stacked silicon nitride film and silicon oxide film. Any other suitable film of similar material can be selected to form the planarization layer, which is not limited herein.

In some implementations, the disclosed method can also be applied to fabricate active driving flexible display panels. After performing Step S102 for cutting the motherboard into multiple separate flexible display panels, and before performing Step S103 for demagnetizing the rigid substrate, the method can further include the following step, as illustrated in FIG. 5.

Step S505: binding a flexible printed circuit board onto each flexible display panel. The binding process can be performed when the rigid substrate is magnetized. The rigid substrate that is magnetized can attract the magnetic first flexible substrate of the motherboard. Thus the warping of the motherboard can be prevented during the binding process, which may not only facilitate the binding process, but also avoid potential damage to the flexible display panels, thereby improving the yield of the flexible display panels. Additionally, after completing the binding process, Step 103 can be performed to separate the motherboard from the rigid substrate by demagnetizing the rigid substrate. The separation operation is simple and reliable.

In some embodiments, the rigid substrate that is magnetisable may be a rigid substrate capable of charging and discharging. In such embodiments, in the Step S102, the rigid substrate can be charged to have magnetism, and in the step S103, the rigid substrate can be discharged to revoke the magnetism. The changing and discharging process can provide a quick and simple control of the generation and revocation of the magnetism of the rigid substrate.

It should be noted that, any other suitable method can be used to generate or revoke the magnetism of the rigid substrate, and should not be limited herein. For example, a magnet can be placed on a side of the rigid substrate that is away from the first flexible substrate to make the rigid substrate having magnetism. And the magnetism can be revoked by removing the magnet from the rigid substrate.

Figure 6:
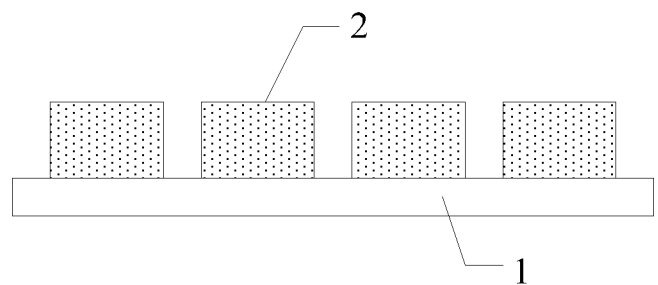
FIGS. 6 and 7 are schematic structural diagrams of an exemplary flexible display substrate in accordance with some embodiments of the disclosed subject matter.
Figure 7:
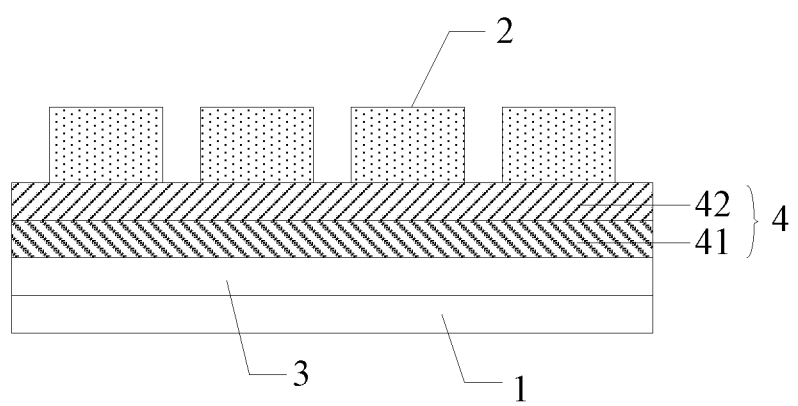

Another aspect of the disclosed subject matter provides a flexible display substrate. Referring to FIGS. 6 and 7, schematic structural diagrams of an exemplary flexible display substrate are shown in accordance with some embodiments of the disclosed subject matter.

As illustrated in FIG. 6, the flexible display substrate can include a magnetic first flexible substrate 1 and multiple display units 2 on the first flexible substrate 1. In some embodiments, when the disclosed flexible display substrate is used for fabricating OLED panels, each display unit can be an organic electroluminescent structure including an anode, a light emitting layer, and a cathode.

Since the disclosed flexible display substrate include a magnetic first flexible substrate, the rigid substrate that is magnetized can attract the magnetic first flexible substrate of the motherboard. Thus after the motherboard being packaged and released, the warping of the motherboard can be prevented during the cutting process, which may not only facilitate the cutting process, but also avoid potential damage to the flexible display panels, thereby improving the yield of the flexible display panels.

In some embodiments, the first flexible substrate is a cured organic resin film that is doped by a magnetic material. A material of the organic resin film can be polyimide (PI) glue, or any other suitable organic resin material.

It should be noted that, the magnetic material is doped in the first flexible substrate, Thus the first flexible substrate can contain more magnetic material if the thickness of the first flexible substrate is larger, therefore the first flexible substrate can have more magnetism. That is, the thickness of the first flexible substrate is positively proportional to the magnetic magnitude of the first flexible substrate. Therefore, a first flexible substrate having a too small thickness may not have enough magnetic force to attract the rigid substrate, which may cause warping of the motherboard during the cutting process. On the other hand, a first flexible substrate having a too large thickness may increase the total thickness of the flexible display panels. Based on the above factors, in some embodiments, a thickness of the first flexible substrate can be in a range of 5 µm to 10 µm. However, the thickness of the first flexible substrate can be adjusted according to actual needs, and should not be limited herein.

In some embodiments, the doped magnetic material can be any suitable material that can have magnetism, such as iron-chromium-cobalt particles, aluminum-nickel-cobalt particles, samarium-cobalt particles, neodymium-iron-boron particles, etc.

It should be noted that, the doping ratio of the magnetic material in the first flexible substrate is positively proportional to the magnetic magnitude of the first flexible substrate, Thus the first flexible substrate can have more magnetism if the doping ratio of the magnetic material of the first flexible substrate is larger. Therefore, a first flexible substrate having a too small doping ratio of the magnetic material may not have enough magnetic force to attract the rigid substrate, which may cause warping of the motherboard during the cutting process. On the other hand, a first flexible substrate having a too large doping ratio of the magnetic material may decrease the flexibility of the flexible display panels. Based on the above factors, in some embodiments, a mass ratio of the magnetic material in the first flexible substrate can be in a range of 15% to 25%. However, the doping ratio of the magnetic material of the first flexible substrate can be adjusted according to actual needs, and should not be limited herein.

In some embodiments, as illustrated in FIG. 7, the disclosed flexible display substrate can further include a second flexible substrate 3 between the first flexible substrate 1 and the display units 2. The second flexible substrate 3 can alleviate the roughness of the first flexible substrate and provide a smooth substrate to the flexible display panels. The material of the second flexible substrate 3 can be an organic resin layer film, such as a polyimide (PI) gel film, or any other suitable organic resin film.

It should be noted that, a too large thickness of the second flexible substrate may increase the total thickness of the flexible display panels, while a too small thickness of the second flexible substrate may not sufficiently alleviate the roughness of the first flexible substrate. Based on the above factors, in some embodiments, a thickness of the second flexible substrate can be in a range of 10 μm to 15 μm.

In some embodiments, the flexible display substrate can further include a planarization layer 4 between the second flexible substrate 3 and the display units 2. The planarization layer 4 can further alleviate the roughness of the first flexible substrate and provide a more smooth substrate to the flexible display panels.

In some embodiments, the planarization layer 4 can include a silicon nitride film 41 and a silicon oxide film 42 stacked sequentially on the second flexible substrate 3. It should be noted that, the silicon nitride film 41 can be located above or under the silicon oxide film 42. The embodiment of the disclosed method is particularly useful for fabricating a flexible OLED. The silicon nitride film and the silicon oxide film can be not only used as the planarization layer, but also as a barrier layer for preventing the oxygen and water in the external environment to enter the flexible OLED to cause damage to the flexible OLED.

It should be noted that, the planarization layer is not limited to the stacked silicon nitride film and silicon oxide film. Any other suitable film of similar material can be selected to form the planarization layer, which is not limited herein.

Another aspect of the disclosed subject matter provides a flexible display panel, including the flexible display substrate described above in connection with FIGS. 6 and 7. The disclosed flexible display panel includes a magnetic first flexible substrate. During the cutting process, binding process, and subsequently attaching process for attaching feature films, such as a protective covering layer, etc., the magnetic first flexible substrate can be worked with a rigid substrate that is magnetisable. The rigid substrate that is magnetized can generate a magnetic force to attract the magnetic first flexible substrate. Thus the motherboard including the magnetic first flexible substrate can be attached to the rigid substrate. Therefore, the warping of the motherboard can be prevented during the cutting process, which may not only facilitate the cutting process, but also avoid potential damage to the flexible display panels, thereby improving the yield of the flexible display panels. Additionally, after completing the cutting process, the motherboard and the rigid substrate can be separated by demagnetizing the rigid substrate, which is simple and reliable.

Another aspect of the disclosed subject matter provides a display apparatus, including a flexible display panel discussed above. The display apparatus can be a smart phone, a tablet computer, a television, a monitor, a notebook computer, a digital picture frame, a navigation system, or any other suitable product or component that has a display function.

Accordingly, a method for fabricating a flexible display substrate and a flexible display panel, and related apparatuses are provided. In the disclosed fabricating method, a motherboard including a magnetic first flexible substrate can be formed on a rigid substrate that is magnetisable. During the cutting process, the rigid substrate that is magnetized can generate a magnetic force to attract the magnetic first flexible substrate. Thus the motherboard including the magnetic first flexible substrate can be attached to the rigid substrate. Therefore, the warping of the motherboard can be prevented during the cutting process, which may not only facilitate the cutting process, but also avoid potential damage to the flexible display panels, thereby improving the yield of the flexible display panels. Additionally, after completing the cutting process, the motherboard and the rigid substrate can be separated by demagnetizing the rigid substrate, which is simple and reliable.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A method for fabricating a flexible display substrate, comprising:
    forming a motherboard on a rigid substrate that is magnetizable, including:
        coating a magnetic first flexible substrate on the rigid substrate; and
        using the magnetic first flexible substrate as a base substrate to form the motherboard, wherein the motherboard comprises the magnetic first flexible substrate and a plurality of flexible display panels on the magnetic first flexible substrate;

cutting the motherboard to separate the plurality of flexible display panels from each other when the rigid substrate is magnetized; and demagnetizing the rigid substrate.

2. The method of claim 1, further comprising:

after forming the motherboard, and before cutting the motherboard to separate the plurality of flexible display panels, separating the motherboard from the rigid substrate.

3. The method of claim 1, wherein coating the magnetic first flexible substrate on the rigid substrate comprises:

coating a first polyimide gel film that is doped with a magnetic material on the rigid substrate; and solidifying the first polyimide gel film that is doped with the magnetic material to form the magnetic first flexible substrate.

4. The method of claim 1, further comprising:

coating a second polyimide gel film on the magnetic first flexible substrate;

solidifying the second polyimide gel film to form a second flexible substrate; and using the magnetic first flexible substrate and the second flexible substrate as a base substrate to form the motherboard comprising the plurality of flexible display panels on the base substrate.

5. The method of claim 4, wherein a thickness of the second flexible substrate is between 10 µm to 15 µm.

6. The method of claim 4, further comprising:

after forming the second flexible substrate and before forming the motherboard comprising the plurality of flexible display panels, forming a planarization layer by stacking a silicon nitride film and a silicon oxide film on the second flexible substrate.

7. The method of claim 1, further comprising:

after cutting the motherboard to separate the plurality of flexible display panels from each other, and before demagnetizing the rigid substrate, binding a flexible printed circuit board on each of the plurality of flexible display panels.

8. The method of claim 1, wherein:

the rigid substrate is magnetized by charging the rigid substrate; and the rigid substrate is demagnetized by discharging the rigid substrate.

9. A flexible display substrate, comprising:

a magnetic first flexible substrate;

a plurality of display units on the magnetic first flexible substrate; and a second flexible substrate between the magnetic first flexible substrate and the plurality of display units, wherein the second flexible substrate is a polyimide gel film.

10. The flexible display substrate of claim 9, wherein the magnetic first flexible substrate is a cured polyimide gel film doped by a magnetic material.

11. The flexible display substrate of claim 10, wherein a thickness of the magnetic first flexible substrate is between 5 µm to 10 µm.

12. The flexible display substrate of claim 10, wherein the magnetic material includes at least one of iron-chromium-cobalt particles, aluminum-nickel-cobalt particles, samarium-cobalt particles, rubidium-iron-boron particles, or neodymium-iron-boron particles.

13. The flexible display substrate of claim 12, wherein a mass ratio of the magnetic material in the magnetic first flexible substrate is between 15% and 25%.

14. The flexible display substrate of claim 9, wherein a thickness of the second flexible substrate is between 10 µm to 15 µm.

15. The flexible display substrate of claim 9, further comprising:

a planarization layer between the second flexible substrate and the plurality of display units, wherein the planarization layer comprises a silicon nitride film and a silicon oxide film that are stacked sequentially on the second flexible substrate.

16. A flexible display panel, comprising the flexible display substrate according to claim 9.

17. A display apparatus, comprising the flexible display panel according to claim 16.

18. A method for fabricating a flexible display substrate, comprising:

forming a motherboard on a rigid substrate that is magnetizable, wherein the motherboard comprises a magnetic first flexible substrate and a plurality of flexible display panels on the magnetic first flexible substrate;

cutting the motherboard to separate the plurality of flexible display panels from each other when the rigid substrate is magnetized;

after cutting the motherboard, binding a flexible printed circuit board on each of the plurality of flexible display panels; and after binding the flexible printed circuit board on each of the plurality of flexible display panels, demagnetizing the rigid substrate.

* * * * *